United States Patent [19]
Takii et al.

[11] Patent Number: 5,325,476
[45] Date of Patent: Jun. 28, 1994

[54] METHOD OF CONVERTING AREA DATA INTO PATH DATA

[75] Inventors: Takaaki Takii, Otsu; Kazuyoshi Waki, Kyoto; Hiroshi Honda, Takatsuki, all of Japan

[73] Assignee: Rohm Co., Ltd., Kyoto, Japan

[21] Appl. No.: 806,394

[22] Filed: Dec. 13, 1991

[30] Foreign Application Priority Data

Dec. 14, 1990 [JP] Japan .................. 2-410901

[51] Int. Cl.$^5$ .............................. G06F 15/62
[52] U.S. Cl. .................... 395/141; 395/133
[58] Field of Search ........... 395/133, 134, 135, 139, 395/141; 345/118

[56] References Cited

U.S. PATENT DOCUMENTS 4,797,836  1/1989  Witek et al. ................. 364/518
5,113,491  5/1992  Yamazaki ..................... 395/141

Primary Examiner—Phu K. Nguyen
Attorney, Agent, or Firm—Nikaido, Marmelstein, Murray & Oram

[57] ABSTRACT

A method of converting an area data, which is a rectangular or polygonal area data having an area, into a path data, which has both a series of central line segments and a width data. The area data is inputted into a computer where the area data is converted into the path data, based upon a connection relation among figures. The path data is then outputted by the computer. The method can also include the steps of determining whether or not the area data can be converted into one path data based upon whether or not the area data has an edge which fulfills a condition of the shape of the outline at corresponding corners, other than the first and last corners counted from one edge are the same, and when the corresponding corners are numbered from the one edge both clockwise and counterclockwise, all the rectangles whose opposite corners are the corresponding corners are included in the original figure. The method can also include the step of forming a path data by connecting the midpoints of corresponding two vertices when the area is determined to be convertible into one path data.

4 Claims, 9 Drawing Sheets

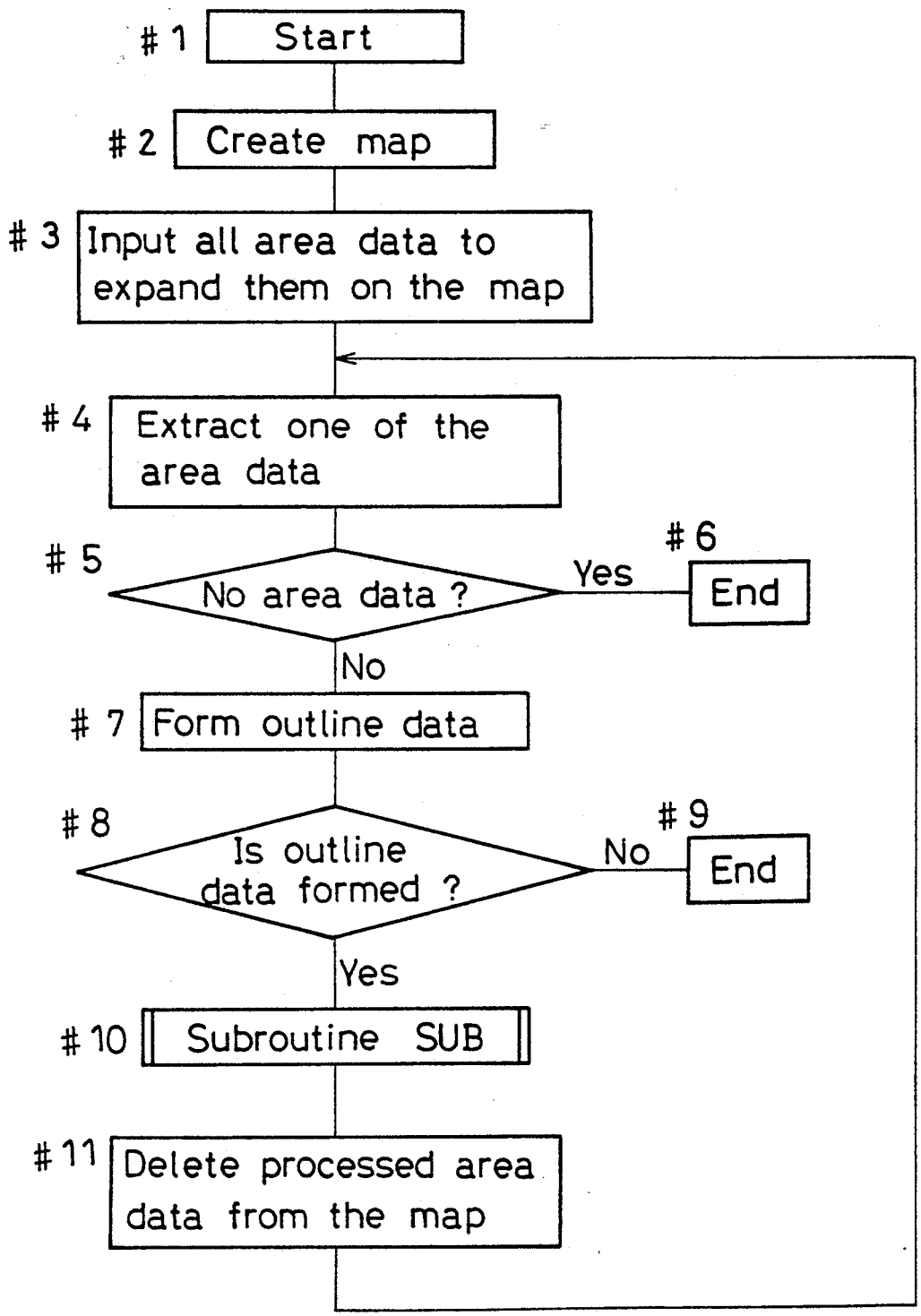

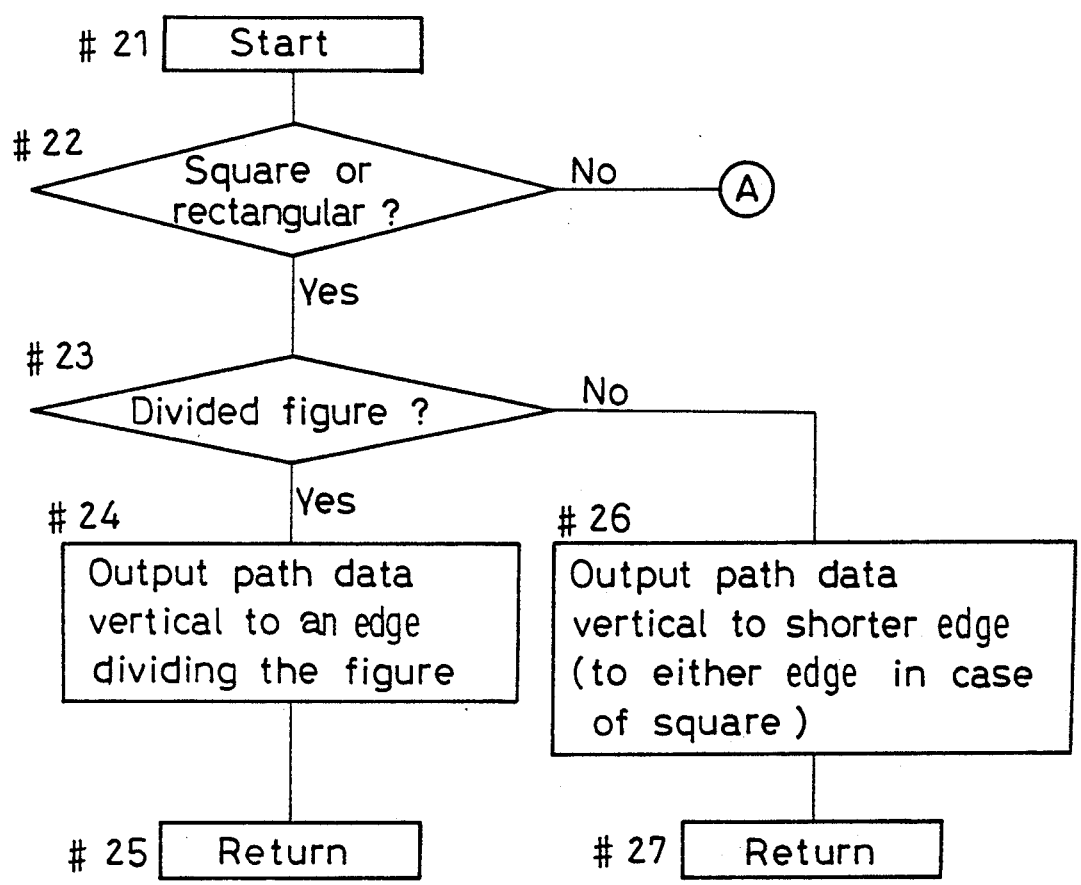

FIG. 3
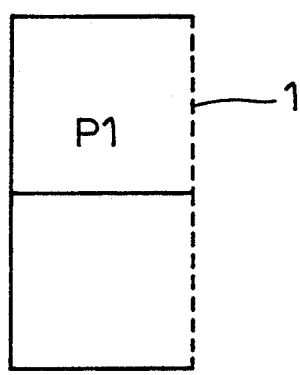
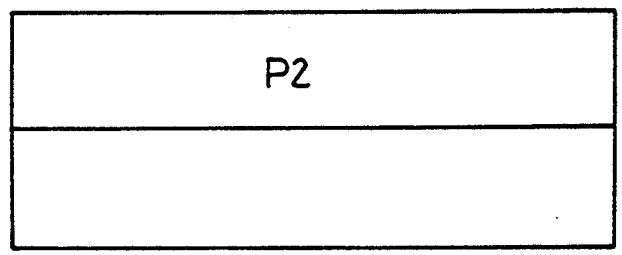
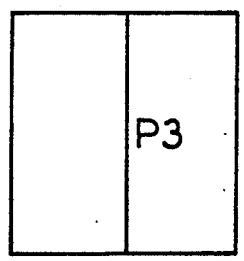 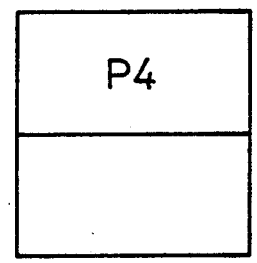

METHOD OF CONVERTING AREA DATA INTO PATH DATA

BACKGROUND OF THE INVENTION

1. Field of the Invention

The present invention relates to a method of converting an area data into a path data for a large scale integrated circuit design assisting apparatus employing a computer.

2. Description of the Prior Art

With respect to a demand for large scale integrated circuits (LSIs) in the field of semiconductor, a greater variety of LSIs is required although the number of each type does not have to be great. For this reason, many kinds of software for automatizing design of LSIs have been developed.

Moreover, a period for designing a new type has sometimes been decreased by changing a part of an LSI which has already been designed.

In changing an LSI which has already been designed, a logic and a layout rule have to be re-verified after the change. A logic simulation for verifying a logic is frequently performed by a computer with the above-described program for design automatization. In this case, with respect to some kinds of input data, e.g. data representing electric connection among devices, there are cases when the data have to be not area data but path data. Moreover, in a program for compressing a pattern (hereinafter referred to as compaction), a part of input data are sometimes limited to path data.

Thus, in trying to decrease a period for design by changing area data of an LSI which has already been designed, if area data are used, the verification and compaction cannot be automatized. Consequently, the number of processes ironically increases.

SUMMARY OF THE INVENTION

An object of the present invention is to provide a method of converting an area data into a path data to enable effective utilization of a program for design automatization.

To achieve the above-described object, according to the present invention, a rectangular or polygonal area data having an area is inputted into a computer where it is converted into a path data having both a series of central line segments and a width data in consideration of a connection relation among figures, and then the path data is outputted by the computer.

If an area data is converted into a path data as described above, programs for design automatization where a part of input data are limited to path data can be utilized. Thereby, it is expected that the number of required processes can largely be reduced.

BRIEF DESCRIPTION OF THE DRAWINGS

This and other objects and features of this invention will become clear from the following description taken in conjunction with the preferred embodiments with reference to the accompanied drawings in which:

FIG. 1 shows a flow chart of a main routine of a program embodying a method according to the present invention;

FIGS. 2A and 2B show a flow chart of a subroutine of the main routine shown in FIG. 1;

FIG. 3 shows a conversion of a rectangular outline data into a path data;

DETAILED DESCRIPTION OF THE PREFERRED EMBODIMENT

The present invention will hereinafter be described with reference to the drawings.

First, a main routine will be described with reference to a flow chart of FIG. 1.

When the program starts (step #1), at step #2, a map of a required size is created based on coordinates of input data to expand area data. At step #3, all the area data are inputted to be expanded on the map. At step #4, one of the area data is extracted. If there are no area data on the map at this time, the process finishes (steps #5 and #6). At step #7, an outline data is formed while area data connecting with the area data extracted at step #4 are being extracted. At step #8, whether or not an outline data is formed is determined. When it is not formed, the process proceeds to step #9, where the process finishes. When it is formed, at step #10, a subroutine SUB is executed. At step #11, the area data which forms the outline data formed at step #4 are deleted from the map. Thereafter, the process returns to step #4, and the above-described processes are repeated until all the area data on the map are deleted.

Figure 2B:
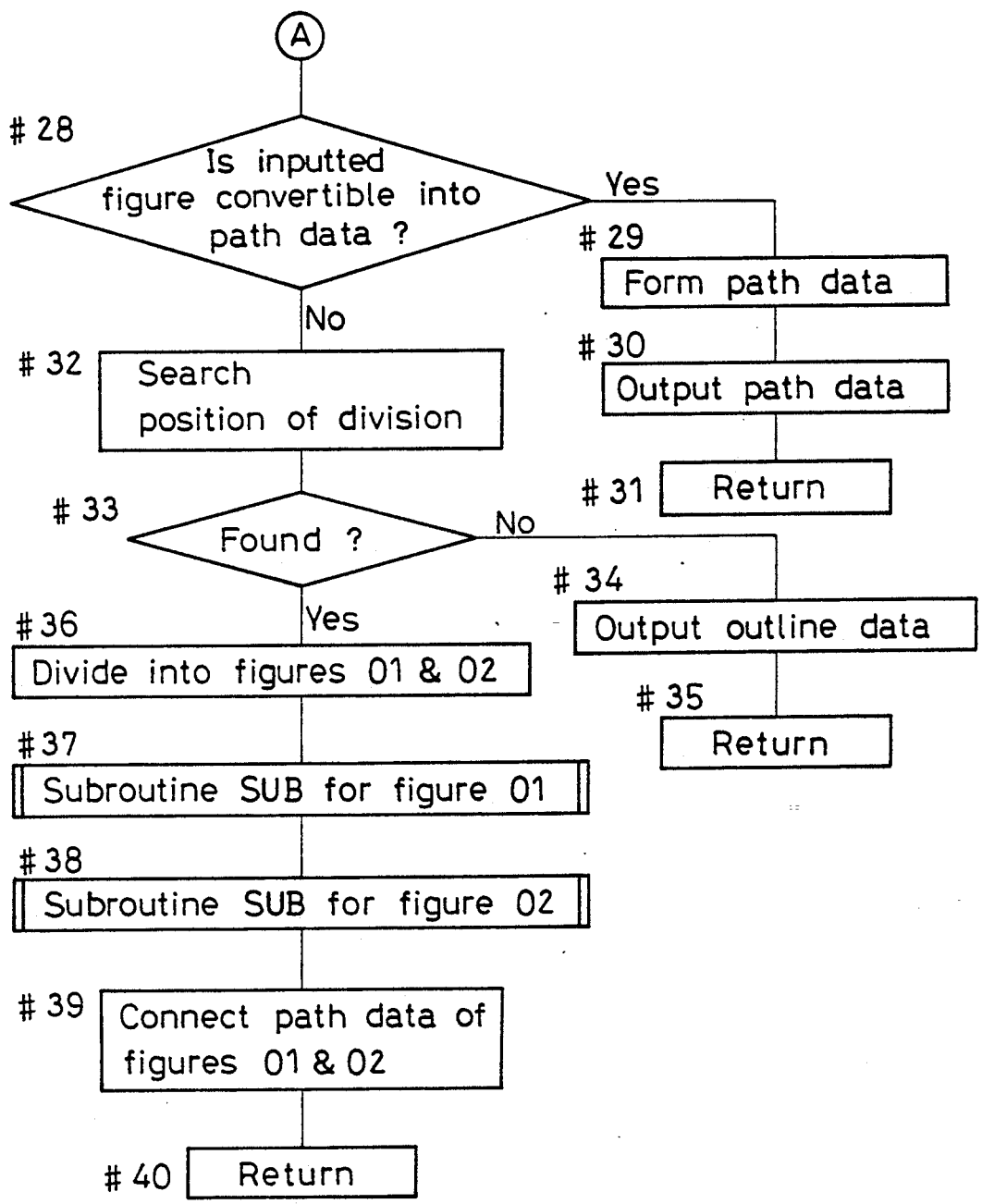

Next, the subroutine SUB will be described with reference to flow charts of FIGS. 2A and 2B.

The outline data formed in the main routine is inputted to start the subroutine SUB (step #21). At step #22, whether or not the inputted outline data is square or rectangular is determined. When it is square or rectangular, the process proceeds to step #23. Otherwise, the process proceeds to step #28 (shown in FIG. 2B).

At step #23, whether or not the inputted square or rect is a divided figure is determined. When it is a divided figure, as shown in FIG. 3, a path data P1 vertical to an edge 1 at which the figure is divided is outputted at step #24, and at step #25, the process returns. When it is not a divided figure, as shown in FIG. 3, a path data P2 vertical to shorter edges is outputted in case of a rect, and a longitudinal path data P3 or a lateral path data P4 is outputted in case of a square at step #26. At step #27, the process returns.

When the outline data is neither square nor rectangular, whether or not it can be converted into one path data is determined at step #28. When it is determined that it can be converted into one path data, at step #29, a path data is formed. After the path data is outputted to a path data file at step #30, the process returns. When it is determined that it cannot be converted into one path data at step #28, the inputted outline data is divided until a figure which can be converted into one path data is obtained. A position of division is searched at step

32. At step #33, whether or not the position of division has been found is determined. When it has not been found, at step #34, the input data (outline data) of the subroutine SUB is outputted to a temporary file. At step #35, the process returns. When the position of division has been found, at step #36, the figure is divided into FIGS. O1 and O2. At steps #37 and #38, the subroutine SUB is recursively called for the FIGS. O1 and O2, respectively. When the FIGS. O1 and O2 are figures which have to be divided, they are divided in the recursively called subroutine SUB.

At step #39, in order to connect a path data converted from the FIG. O1 into a path data converted from the FIG. O2, an appropriate one of the path data is extended until it connects with the other path data. At step #40, the process returns.

Now, data formats of the above-described data will be described. The area data is a data consisting of vertices with coordinates x and y arranged along an outline of a figure. The path data is a data where each vertex of a series of lines is shown by coordinates (x, y) and to which width information is added.

Although the above-described outline data has a data format the same as that of the area data, in this specification, the data is called an outline data to indicate that an outline of plural area data connecting with each other is extracted.

Figure 4:
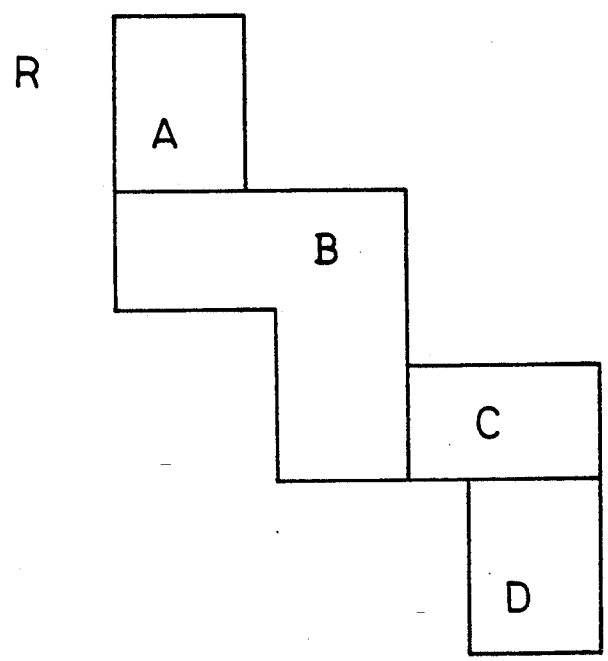
FIG. 4 shows an area data.
Figure 5:
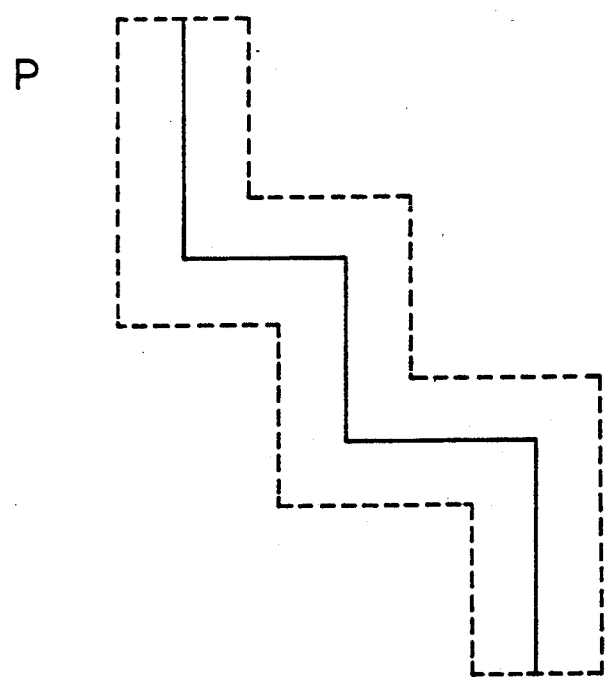
FIG. 5 shows a path data to be outputted.

Processes will be described where an area data R consisting of three rectangles A, C, and D and a polygon B as shown in FIG. 4 is inputted and a path data P (a solid line) as shown in FIG. 5 is outputted. In the following description, step #n is step #n of the flow charts of FIGS. 1, 2A, and 2B.

Figure 6:
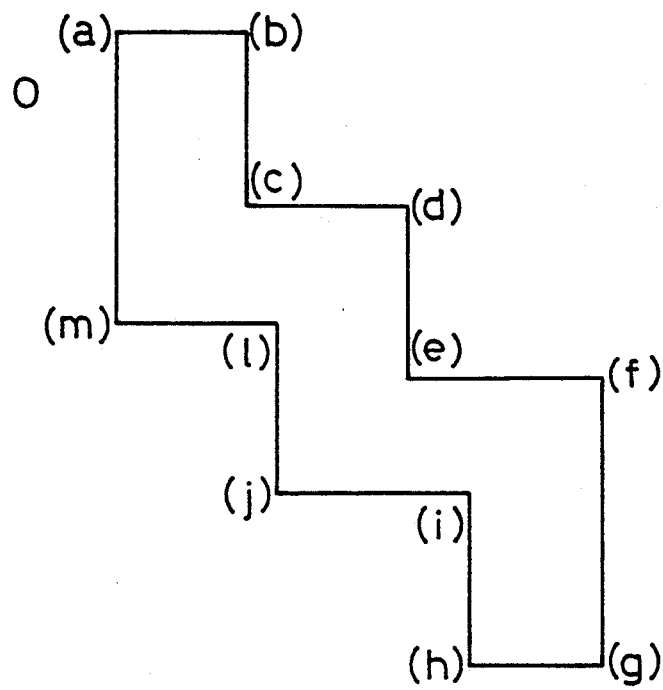
FIG. 6 shows an outline data.

At step #3, the inputted area data R is expanded on a map. When an area data B is extracted from the area data R at step #4, at step #7, an outline data O is formed which also includes area data A, C, and D connecting with the area data B as shown in FIG. 6. Since the outline data O is formed, at step #10, the subroutine SUB is executed.

In the subroutine SUB, at step #22, whether or not the outline data O is square or rectangular is determined. Since the outline data O is neither square nor rectangular, the process proceeds to step #28, where whether or not the outline data O can be converted into one path data is determined. If an edge which fulfills both of the following two conditions is found, the outline data O can be converted into one path data.

Condition 1: Manners of bending of the outline at corresponding corners other than the first and last corners counted from one edge are the same.

Condition 2: When the corresponding corners are numbered from the above-mentioned edge both clockwise and counter clockwise, all the rectangles whose opposite corners are the corresponding corners (that is, two corners given the same number) are included in the original figure (that is, the outline data O).

Figure 7:
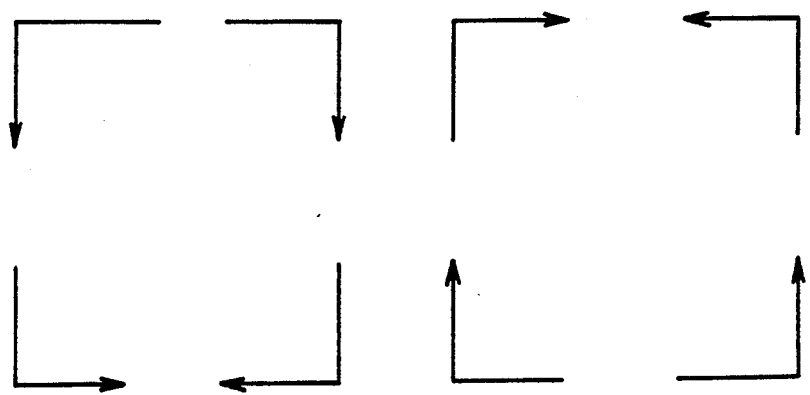
FIG. 7 shows manners of bending of the outline of a figure.

As shown in FIG. 7, there are eight kinds of manners of bending.

Figure 8:
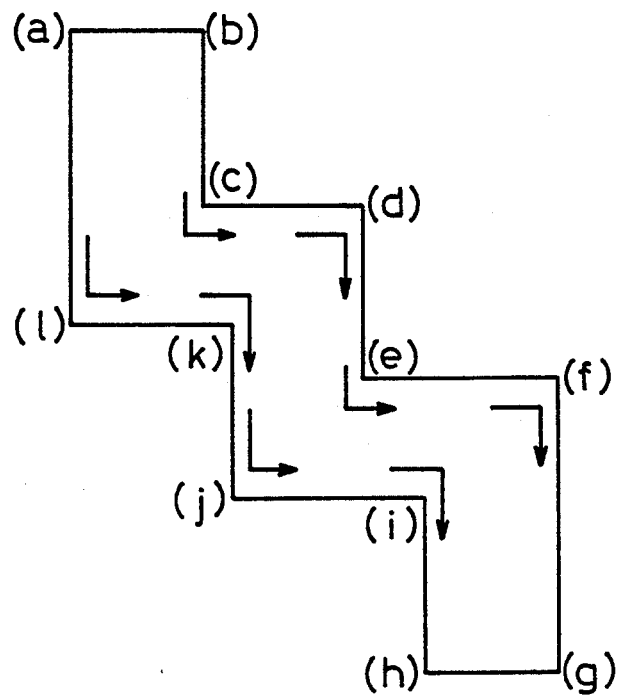
FIG. 8 shows a condition of conversion into a path data.
Figure 9:
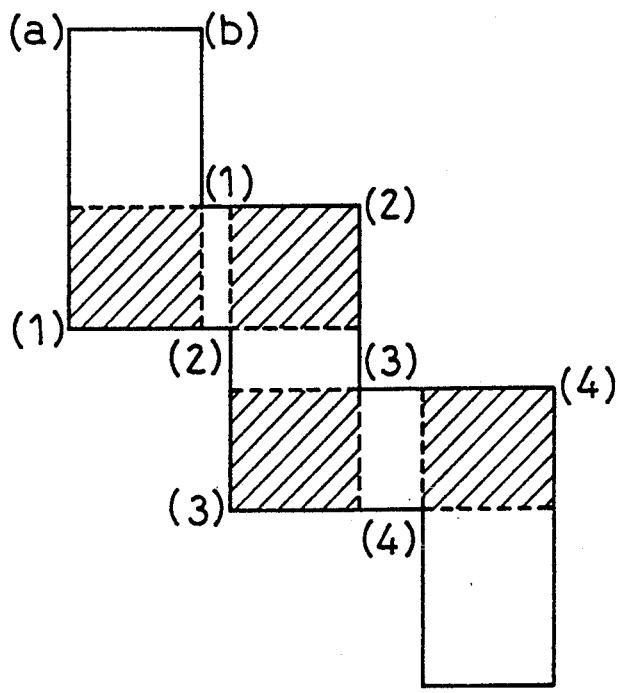
FIG. 9 shows a condition of conversion into a path data.

In FIG. 8, whether or not an edge (a)-(b) fulfills the condition 1 is determined. Vertices (c) and (l), (d) and (k), (e) and (j), and (f) and (i) have the same manners of bending, respectively. Thus, the edge (a)-(b) fulfills the condition 1. In FIG. 9, whether or not the edge (a)-(b) fulfills the condition 2 is determined. All the rectangles (shown by the oblique lines) whose opposite corners are the corresponding vertices are included in the outline data O. Thus, the edge (a)-(b) fulfills the condition 2.

Therefore, it is determined that the outline data O can be converted into one path data. In case of the outline data O, an edge (h)-(g) also fulfills the above-described two conditions. However, it is not required to make a determination on another edge if it is found that one of the edge fulfills the conditions.

Figure 10:
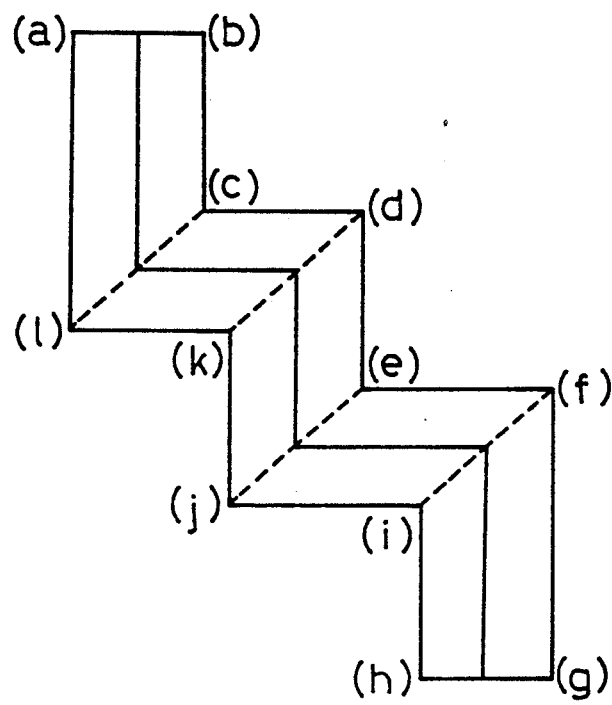
FIG. 10 shows a method of converting into a path data.

At step #29, a path data is formed by connecting midpoints of the corresponding two vertices starting from a midpoint of the edge (a)-(b) found at step #28 as shown in FIG. 10. After the path data is outputted to a path data file at step #30, the process returns at step #31.

In the main routine, at step #11, the area data A, B, C, and D constituting the outline data O processed in the subroutine SUB are deleted from the map. Thereafter, the process returns to step #4 to extract the next area data. However, since there are no area data, the process finishes at step #6.

Figure 11:
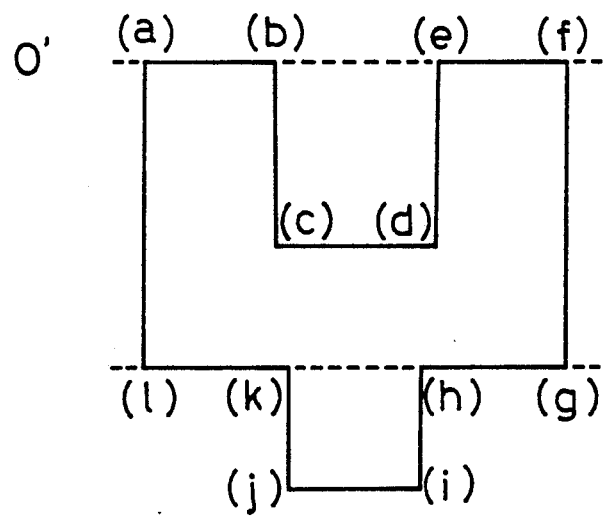
FIG. 11 shows an outline data which is required to be divided.

In a case where an outline data O' as shown in FIG. 11 is inputted to the subroutine SUB, since an edge which fulfills the above-described two conditions cannot be found, the outline data O' cannot be converted into a path data. At step #32, a position of division of the outline data O' is found. First, a portion where four or more vertices are found on a line parallel to the x-axis or y-axis is detected to form an edge which connects the outside two vertices. Then, whether or not portions are found which are not included in the figure on both edges (in a vertical direction if the edge is parallel to the x-axis) of the edge is detected. When the portions are found only on one edge, the above-mentioned edge is selected as the position of division. In FIG. 11, four or more vertices which are on the same line are (a), (b), (e), (f), and (l), (k), (h), and (g). The edge (a)–(f) has portions which are not included in the figure on both edges thereof. The edge (l)–(g) has the portion only on one edge (lower edge) thereof. Therefore, the edge (l)–(g) is selected as the portion of division. When two or more portions of division are found, the edge is selected where the difference between the numbers of the vertices of two outline data obtained by the division by the edge is the fewest.

Figure 12:
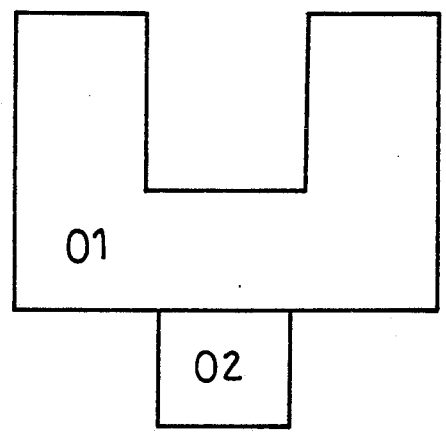
FIG. 12 shows a divided outline data.
Figure 13:
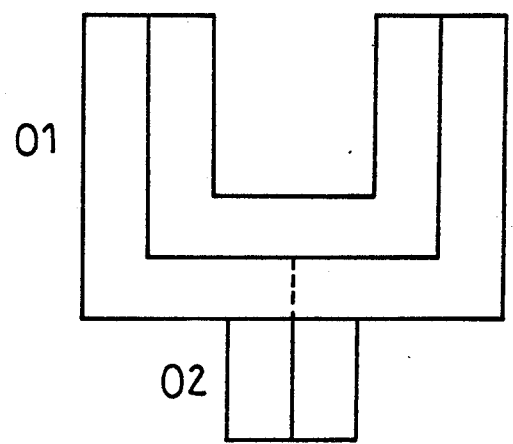
FIG. 13 shows a path data converted from the divided outline data and a connection thereof.

The outline data O' is divided into outline data O1 and O2 as shown in FIG. 12. The subroutine SUB is executed with respect to both of the outline data O1 and O2. FIG. 13 shows a path data outputted from the outline data O1 and O2. The outline data O2 is processed as the divided figure (square) at steps #23 and #24 of the subroutine SUB.

Moreover, at step #39, the path data of the outline data O2 is extended until it connects with that of the outline data O1 (the extended portion is shown by the dotted line in the figure). At step #40, the process returns.

As described above, according to the present invention, an area data can easily be converted into a path data. Hence, in processing an area data which has already been designed with a design automatization program, a preprocessing where the area data is converted into a path data is performed by use of a program employing the method according to the present invention. If a design automatization program or tool is effectively used as described above, even though a preprocessing is required, the number of required processes can largely be reduced as a whole since existing layout data can be used.

Obviously, many modifications and variations of the present invention are possible in light of the above teachings. It is therefore to be understood that within the scope of the appended claims, the invention may be practiced other than as specifically described.

What is claimed is:

1. A method of converting an area data into a path data, in which the area data is a rectangular or polygonal area data having an area, said method comprising the steps of:

inputting the area data into a computer where said area data is converted into the path data, the path data having both a series of central line segments and a width data based upon a connection relation among figures; and outputting the path data by the computer.

2. A method of converting an area data into a path data, said method comprising the steps of:

determining, when an outline of a polygonal area data having an area is other than square and rectangular, whether or not said area data can be converted into one path data based on whether or not said area data has an edge which fulfills the following conditions 1 and 2:

the condition 1: a shape of the outline at corresponding corners other than the first and last corners counted from one edge are the same;

the condition 2: when the corresponding corners are numbered from said one edge both clockwise and counter clockwise, all the rectangles whose opposite corners are the corresponding corners (that is, two corners given the same number) are included in the original figure (that is, the outline); and forming a path data by connecting the midpoints of corresponding two vertices when said area data is determined to be convertible into one path data.

3. A method of converting an area data into a path data, said method comprising the steps of:

determining, when an outline of a polygonal area data having an area is other than square and rectangular, whether or not said area data can be converted into one path data based on whether or not said area data has an edge which fulfills the following conditions 1 and 2:

the condition 1: a shape of the outline at corresponding corners other than the first and last corners counted from one edge are the same;

the condition 2: when the corresponding corners are numbered from said one edge both clockwise and counter clockwise, all the rectangles whose opposite corners are the corresponding corners (that is, two corners given the same number) are included in the original figure (that is, the outline);

detecting a portion where four or more vertices are found on a line parallel to the x-axis or y-axis to form an edge which connects the outside two vertices when said area data is not convertible into one path data;

detecting whether or not portions are found which are not included in the figure on both edges of said edge and selecting said edge as a position of division when the portions are found only on one edge of said both edges; and forming a path data from each figure formed by the division.

4. A method of converting according to claim 3, wherein when a plurality of portions of division are found, an edge is selected where the difference between the numbers of the vertices of outline data formed by the division is the fewest.

* * * * *